(12) United States Patent  
Yang

(10) Patent No.: US 11,672,180 B2  
(45) Date of Patent: Jun. 6, 2023

(54) SEMICONDUCTOR DEVICES AND METHODS OF MANUFACTURING

(71) Applicant: Taiwan Semiconductor Manufacturing Co., Ltd., Hsinchu (TW)

(72) Inventor: Tsung-Hsueh Yang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 141 days.

(21) Appl. No.: 16/953,751

(22) Filed: Nov. 20, 2020

(65) Prior Publication Data

US 2022/0052255 A1 Feb. 17, 2022

Related U.S. Application Data

(60) Provisional application No. 63/064,087, filed on Aug. 11, 2020.

(51) Int. Cl.
| | |
|---|---|
| H01L 43/12 | (2006.01) |
| H01L 43/02 | (2006.01) |
| H01L 27/22 | (2006.01) |

(52) U.S. Cl.
CPC ............ H01L 43/12 (2013.01); H01L 27/222 (2013.01); H01L 43/02 (2013.01)

(58) Field of Classification Search
CPC ................................ H01L 43/12; H01L 43/02
See application file for complete search history.

(56) References Cited

U.S. PATENT DOCUMENTS

| | | |
|---|---|---|
| 8,963,236 B2 | 2/2015 | Song et al. |
| 8,987,846 B2 | 3/2015 | Kumura |
| 9,691,968 B2 | 6/2017 | Ito |
| 10,283,698 B2 | 5/2019 | Ko et al. |
| 10,727,274 B2 | 7/2020 | Chen et al. |
| 10,879,456 B2 | 12/2020 | Liou et al. |
| 2015/0056722 A1 | 2/2015 | Li et al. |
| 2018/0159023 A1* | 6/2018 | Suh ........................ H01L 43/02 |
| 2018/0211995 A1 | 7/2018 | Bak et al. |
| 2019/0027537 A1 | 1/2019 | Wiegand et al. |
| 2020/0136026 A1 | 4/2020 | Peng et al. |
| 2020/0136036 A1 | 4/2020 | Wu et al. |

(Continued)

FOREIGN PATENT DOCUMENTS

| | | |
|---|---|---|
| DE | 102012111705 A1 | 6/2013 |
| DE | 102019116882 A1 | 1/2020 |
| DE | 102019114226 A1 | 4/2020 |

(Continued)

*Primary Examiner* — Shih Tsun A Chou  
(74) *Attorney, Agent, or Firm* — Slater Matsil, LLP

(57) ABSTRACT

Semiconductor devices and methods of manufacturing the semiconductor devices are provided in which spacers are utilized in order to help protect bottom electrode vias. In embodiments, an opening is formed through dielectric layers, and spacers are formed along sidewalls of the dielectric layers. A bottom electrode via is formed adjacent to the spacers, a bottom, electrode is formed, a magnetic tunnel junction (MTJ) structure is formed over the bottom electrode, and a top electrode is formed over the MTJ structure. The structure is patterned, and the spacers help to protect the bottom electrode via from undesired damage during the patterning process.

20 Claims, 29 Drawing Sheets

(56) References Cited

U.S. PATENT DOCUMENTS

2021/0305495 A1* 9/2021 Shen .................. H01L 43/02

FOREIGN PATENT DOCUMENTS

| KR | 20180125950 A | 11/2018 |
| KR | 20200049440 A | 5/2020 |
| KR | 20200050386 A | 5/2020 |
| WO | 2014148587 A1 | 9/2014 |

* cited by examiner

SEMICONDUCTOR DEVICES AND METHODS OF MANUFACTURING

PRIORITY CLAIM AND CROSS-REFERENCE

This application claims the benefit of U.S. Provisional Application No. 63/064,087, filed on Aug. 11, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
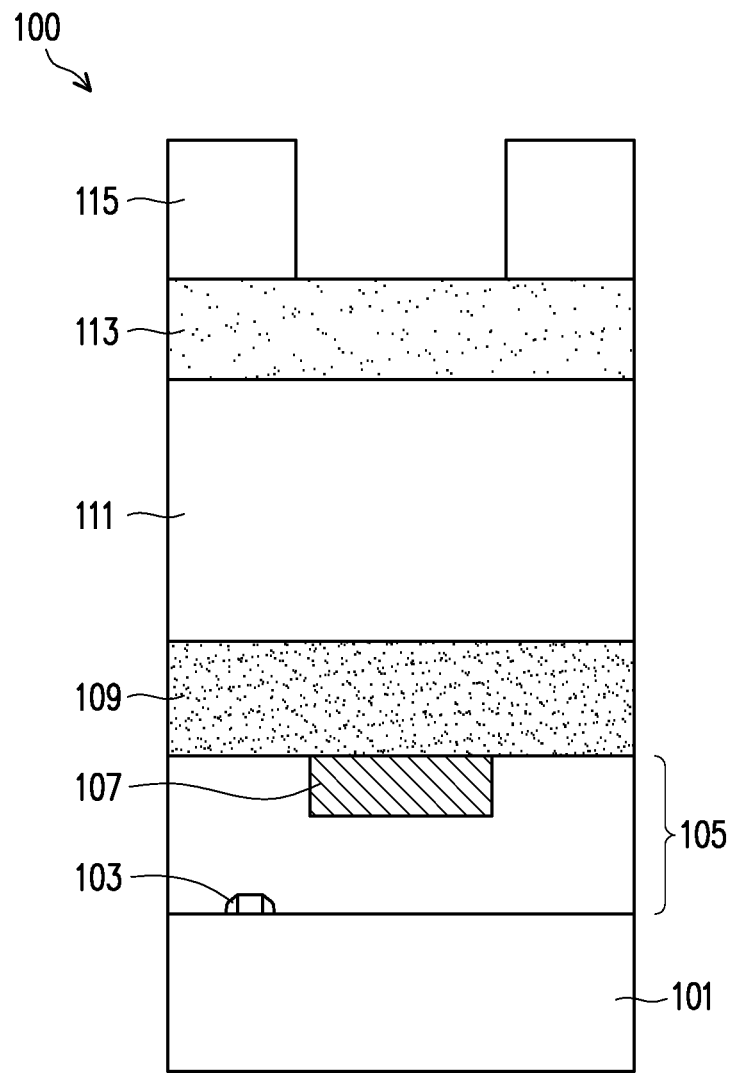
FIG. 1 illustrates a formation of dielectric layers over a substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which spacers 401 are utilized to protect a bottom electrode via 501 providing electrical connection to a magnetic random access memory (MRAM) device 100. However, the embodiments discussed herein may be implemented in a wide variety of structures and methods, and all such embodiments are fully intended to be included within the scope of the discussion.

With reference now to FIG. 1, FIG. 1 illustrates an intermediate manufacture of a MRAM device 100, wherein the MRAM device 100 comprises a semiconductor substrate 101, active devices 103 within an active region of the semiconductor substrate 101, metallization layers 105 located over the active devices 103, and a conductive line 107 located within an upper layer of the metallization layers 105.

In an embodiment the semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include active devices 103. As one of ordinary skill in the art will recognize, a wide variety of active devices and passive devices such as transistors (e.g., planar transistors, finFETs (fin field effect transistors), nanowire transistors, etc.), capacitors, resistors, combinations of these, and the like may be used to generate the desired structural and functional requirements of the design for the MRAM device 100. The active devices 103 may be formed using any suitable methods.

The metallization layers 105 are formed over the semiconductor substrate 101 and the active devices 103 and are designed to connect the various active devices 103 to form functional circuitry. While illustrated in FIG. 1 as a single layer, the metallization layers 105 are formed of alternating layers of dielectric and conductive material and may be formed through any suitable process (such as deposition, damascene, dual damascene, etc.). In an embodiment there may be one or more layers of metallization over the semiconductor substrate 102, but the precise number of metallization layers 105 is dependent upon the design of the semiconductor device.

The conductive line 107 is formed as part of the conductive portions of the metallization layers 105. In a particular embodiment the conductive line 107 is formed using a damascene or dual damascene process, whereby an opening is formed within a dielectric portion of the metallization layers 105, and the opening is filled with one or more conductive materials, such as barrier layers and fill materials such as copper. However, any suitable method may be utilized.

FIG. 1 also illustrates formation of a first dielectric layer 109, a second dielectric layer 111, and a third dielectric layer 113 formed over the conductive line 107. The first dielectric layer 109 may comprise a dielectric material such as SiCN, SiOCN or SiOC, silicon oxide, silicon nitride, phospho-silicate glass (PSG), boro-silicate glass (BSG), boron-doped phospho-silicate glass (BPSG), undoped silicate glass (USG), combinations of these, or the like, formed using a deposition process such as atomic layer deposition, chemical vapor deposition, physical vapor deposition, combinations of these, or the like. The first dielectric layer 109 may be deposited to a thickness of between about 100 Å and about 300 Å. However, any suitable material, any suitable deposition process, and any suitable thickness may be utilized.

The second dielectric layer 111 is formed over the first dielectric layer 109. In an embodiment the second dielectric layer 111 may be a dielectric material different from the first dielectric layer 109 such as a silicon-rich oxide (SRO), silicon oxycarbide, SiCN, or SiOCN, silicon oxide, silicon nitride, phospho-silicate glass (PSG), boro-silicate glass (BSG), boron-doped phospho-silicate glass (BPSG), undoped silicate glass (USG), combinations of these, or the like, formed by using a deposition process such as atomic layer deposition, chemical vapor deposition, physical vapor deposition, combinations of these, or the like. The second dielectric layer 111 may be deposited to a thickness of between about 600 Å and about 1200 Å. However, any suitable materials, any suitable methods of deposition, and any suitable thickness may be utilized.

The third dielectric layer 113 is formed over the second dielectric layer 111. In an embodiment the third dielectric layer 113 may be a dielectric material different from the second dielectric layer 111 such as a nitrogen-free anti-reflective layer (NFARC), a silicon-rich oxide (SRO), silicon oxycarbide, SiCN, SiOCN, silicon oxide, silicon nitride, phospho-silicate glass (PSG), boro-silicate glass (BSG), boron-doped phospho-silicate glass (BPSG), undoped silicate glass (USG), combinations of these, or the like. Is some embodiments, the third dielectric layer 113 is formed by atomic layer deposition, chemical vapor deposition, physical vapor deposition, combinations of these, or the like. The third dielectric layer 113 may be deposited to a thickness of between about 200 Å and about 400 Å. However, any suitable materials, any suitable methods of deposition, and any suitable thickness may be utilized.

FIG. 1 additionally illustrates placement of a first photoresist 115 over the third dielectric layer 113 in order to help pattern a first opening 201 (not illustrated in FIG. 1 but illustrated and described further below with respect to FIG. 2) through the third dielectric layer 113, the second dielectric layer 111, and partially into the first dielectric layer 109. In an embodiment the first photoresist 115 may be tri-layer photoresist (including, e.g., a bottom anti-reflective layer, a hard mask layer, and a photosensitive layer) or even a single layer of a photosensitive layer. Any suitable number of layers may be utilized.

In an embodiment the first photoresist 115 may be deposited or placed using one or more processes such as chemical vapor deposition, atomic layer deposition, spin-on processes, combinations of these, or the like. Once the first photoresist 115 is in place, the photosensitive layer may be patterned by exposing the photosensitive layer to a patterned energy source (e.g., light). Once exposed, the photosensitive layer may be developed, and then used as a mask to pattern underlying layers of the first photoresist 115 and to expose the third dielectric layer 113.

Figure 2:
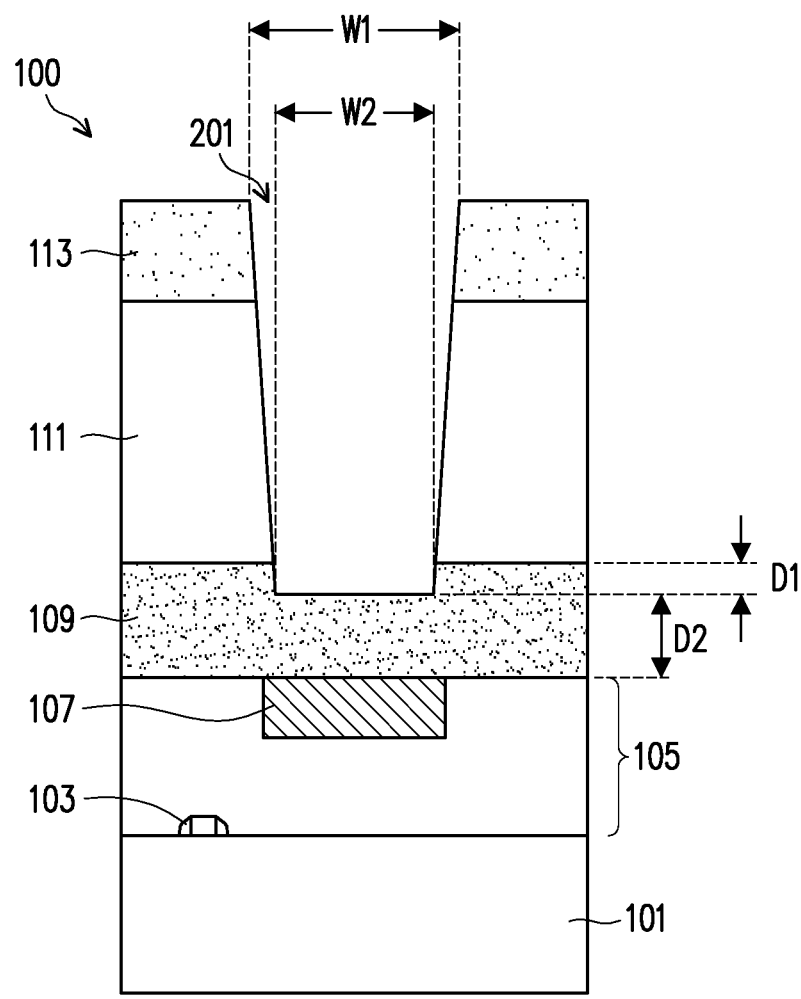
FIG. 2 illustrates formation of a first opening in the dielectric layers, in accordance with some embodiments.

FIG. 2 illustrates that, once the first photoresist 115 has been patterned, the first opening 201 may be formed. In an embodiment the first opening 201 may be formed using one or more dry etches, such as reactive ion etches, which utilize the first photoresist 115 as a mask in order to sequentially etch through the third dielectric layer 113, the second dielectric layer 111, and the first dielectric layer 109. However, any suitable etching processes may be utilized.

In an embodiment the first opening 201 may be formed to have a first width W1 along a top of the first opening 201 of between about 27 nm and about 80 nm, or between about 50 nm and about 60 nm. Additionally, given the directional nature of the etching processes, the first opening 201 may also have a second width W2 along a bottom of the first opening 201 of between about 50 nm and about 70 nm. However, any suitable widths may be utilized.

Additionally, while the etching processes described may form the first opening 201 completely through the third dielectric layer 113 and the second dielectric layer 111, the etching processes in this embodiment may form the first opening 201 only partially through the first dielectric layer 109. As such, the first opening 201 may extend into the first dielectric layer 109 a first distance D1 of between about 50 Å and about 150 Å. By stopping the etching process, a portion of the first dielectric layer 109 remains between the first opening 201 and the conductive line 107, wherein the portion of the first dielectric layer 109 may have a second distance D2 of between about 100 Å and about 150 Å. However, any suitable distance may be utilized.

Figure 3:
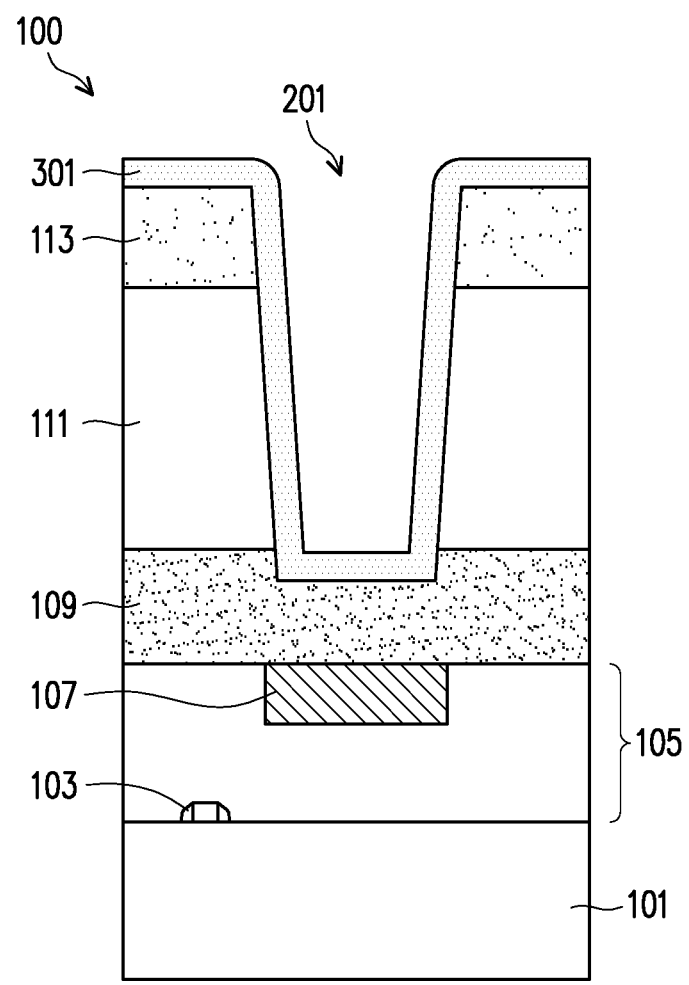
FIG. 3 illustrates formation of a spacer material, in accordance with some embodiments.

FIG. 3 illustrates a deposition of a first spacer material 301 to line the first opening 201. In an embodiment the first spacer material 301 may be a dielectric material that has a high selectivity to subsequent etching process (e.g., the wet etching process used to etch the second dielectric layer 111 described below with respect to FIG. 7A). For example, the first spacer material 301 may be a material that has a good selectivity to oxide for an etchant of dilute hydroflouric acid (dHF). For example, an oxide/silicon nitride etch selectivity is greater than 10 when an etchant such as dilute hydroflouric acid (dHF, with, e.g., a volume ratio of H2O:HF of about 100:1) and the first spacer material 301 such as silicon nitride are used. In particular embodiments, the first spacer material 301 may be a material such as silicon nitride (SiNx), silicon oxynitride (SiOxNy), silicon oxide (SiOx), silicon oxycarbide (SiCxOy), silicon oxycarbonitride (SiCxOyNz), silicon carbon (SiCx), wherein x, y, and z may independently be any positive number, combinations of these, or the like. However, any suitable material may be used.

The first spacer material 301 may be deposited using a deposition process such as plasma enhanced atomic layer deposition, atomic layer deposition, chemical vapor deposition, plasma enhanced chemical vapor deposition, physical vapor deposition, combinations of these, or the like. Additionally, the first spacer material 301 may be deposited to a thickness of between about 10 Å and about 100 Å. However, any suitable deposition process and thickness may be utilized.

Figure 4:
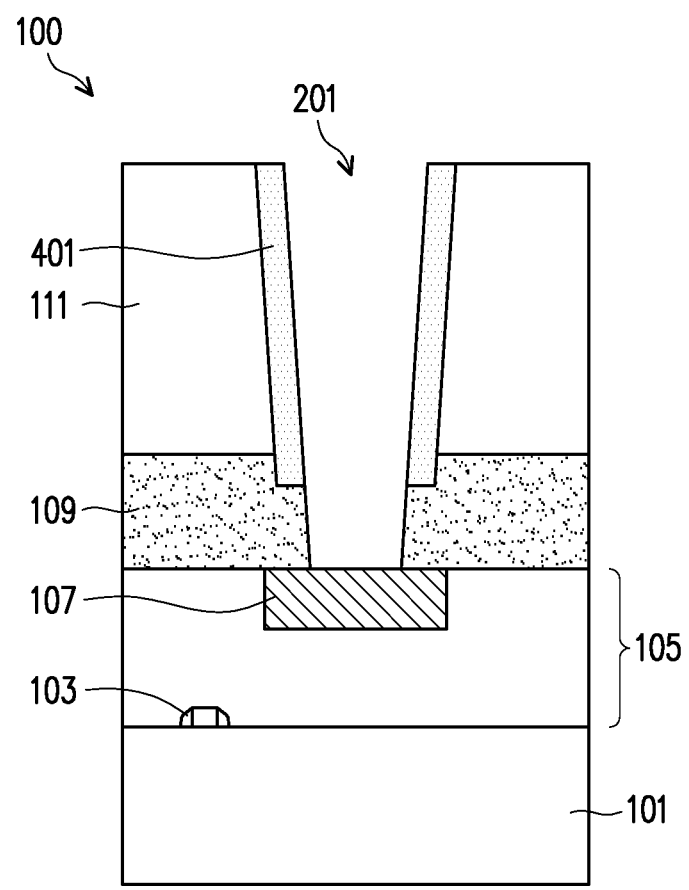
FIG. 4 illustrates formation of a spacer, in accordance with some embodiments.

FIG. 4 illustrates a liner removal process which additionally patterns the first spacer material 301 to form spacers 401. In an embodiment the liner removal process may be an anisotropic dry etching process utilizing etchants that are selective to the material of the first spacer material 301. As such, the anisotropic etching process will remove horizontal portions of the first spacer material 301 (e.g., portions located along the third dielectric layer 113 and along a bottom of the first opening 201) while leaving behind vertical portions of the first spacer material 301 (e.g., portions located along sidewalls of the first opening 201). As such, the spacers 401 are formed along the sidewalls of the first opening 201.

Additionally, once the horizontal portions of the first spacer material 301 have been removed from the third dielectric layer 113 (to expose the third dielectric layer 113) and also removed from the bottom of the first opening 201 (to expose the first dielectric layer 109), the third dielectric layer 113 may be removed and the first dielectric layer 109 may be punched through to expose the conductive line 107. In an embodiment the third dielectric layer 113 and the first dielectric layer 109 may be removed using one or more etching processes such as dry etching processes using etchants selective to the materials of the third dielectric layer 113 and the first dielectric layer 109. In some embodiments, the same etching process used to form the spacers 401 may be used to remove the third dielectric layer 113 and the first dielectric layer 109. However, any suitable number of etching processes may be used.

Figure 5:
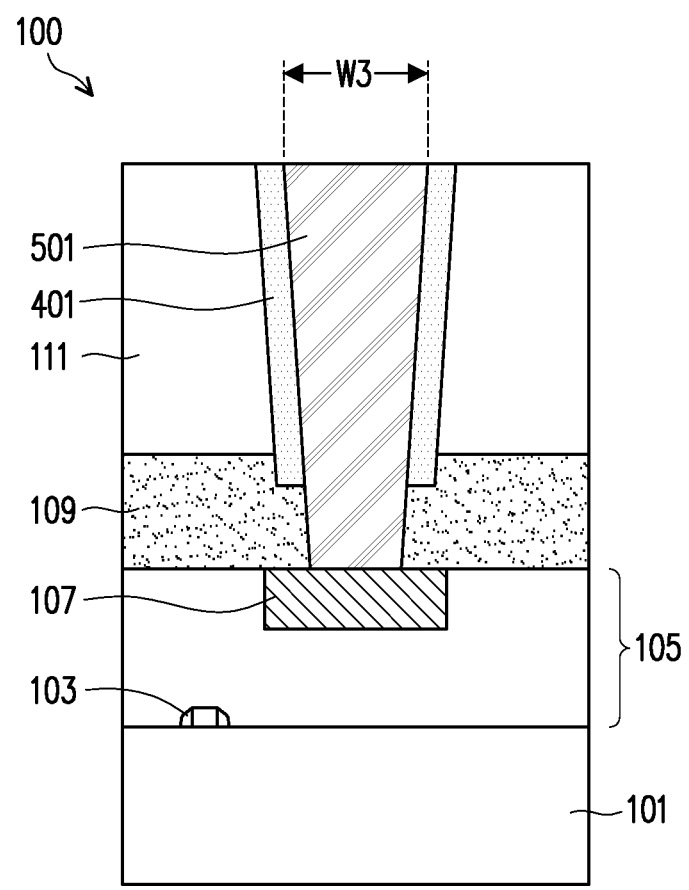
FIG. 5 illustrates formation of a bottom electrode via, in accordance with some embodiments.

FIG. 5 illustrates a formation of a bottom electrode via 501 within the first opening 201. In an embodiment the bottom electrode via 501 may comprise a barrier layer (not independently illustrated for clarity) and a conductive fill material. The barrier layer may be a material such as titanium, titanium nitride, tantalum, tantalum nitride, combinations of these, or the like, using a deposition process such as atomic layer deposition, chemical vapor deposition, physical vapor deposition, combinations of these, or the like. However, any suitable materials and method of manufacture may be utilized.

The conductive fill material may comprise copper, although other suitable materials such as aluminum, alloys, doped polysilicon, combinations thereof, and the like, may alternatively be utilized. The conductive fill material may be formed by initially depositing a seed layer (not shown) and then electroplating copper onto the seed layer, filling and overfilling the first opening 201. Once the first opening 201 has been filled, excess barrier layer, seed layer, and conductive fill material outside of the first opening 201 may be removed through a planarization process such as chemical mechanical polishing (CMP), although any suitable removal process may be used.

As illustrated in FIG. 5, by forming the spacers 401 prior to the forming of the bottom electrode via 501, the spacers 401 cover upper portions of the sidewalls of the bottom electrode via 501, while lower portions of the sidewalls of the bottom electrode via 501 are not covered by the spacers 401 and are in direct physical contact with the first dielectric layer 109. In a particular embodiment a ratio of the covered sidewalls to the uncovered sidewalls may be between about 6 and about 12. However, any suitable amount may be utilized.

Additionally, by utilizing the spacers 401, the overall dimensions of the bottom electrode via 501 may be further reduced without risk of damage or exposure during subsequent etching processes. For example, by using the spacers 401 the bottom electrode via 501 may have a reduced third width W3 of between about 25 nm and about 40 nm, such as less than 40 nm. Additionally, by protecting the bottom electrode via 501 with the spacers 401, further processes (e.g., subsequent etching processes) do not have to be as tightly controlled in order to avoid damaging the bottom electrode via 501, allowing for an increase in the overall process window and greater flexibility.

Figure 6:
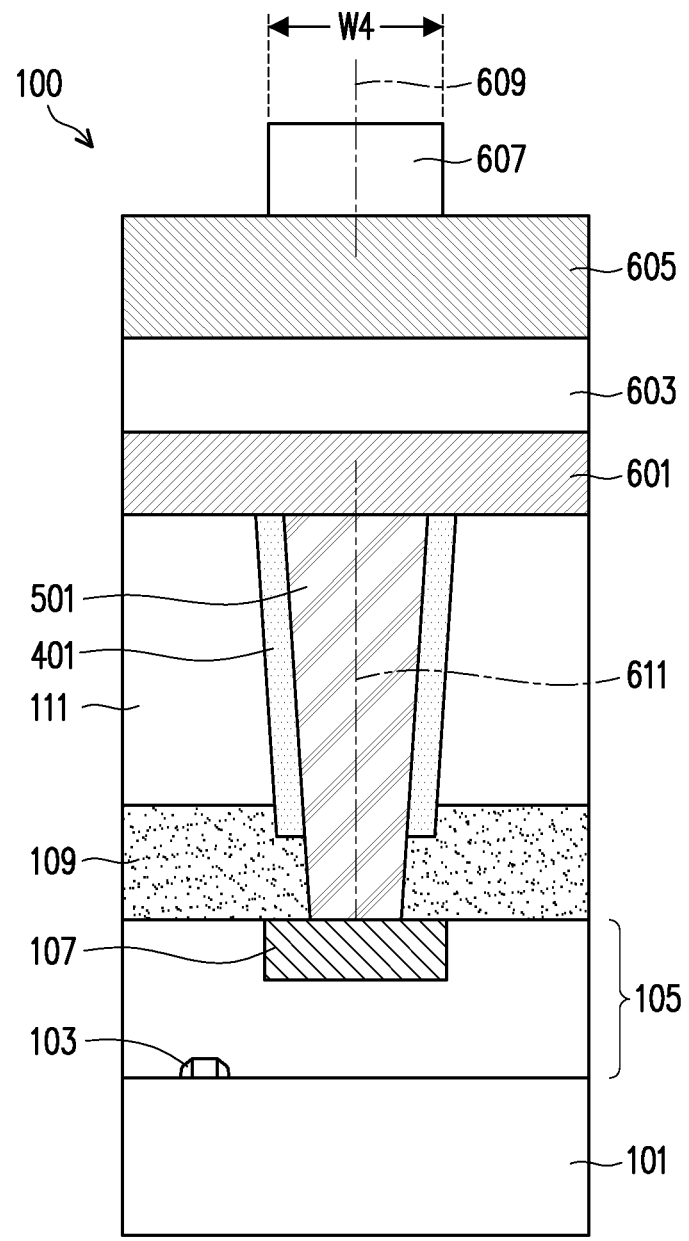
FIG. 6 illustrates deposition of a bottom electrode, an MTJ structure, and a top electrode, in accordance with some embodiments.

FIG. 6 illustrates formation of a bottom electrode 601, a magnetic tunnel junction (MTJ) structure 603 and a top electrode 605. The bottom electrode 601 is formed over the second dielectric layer 111, is in physical contact with the bottom electrode via 501, and is in electrical connection with the conductive line 107. In an embodiment the bottom electrode 601 includes a conductive material such as titanium (Ti), tantalum (Ta), platinum (Pt), ruthenium (Ru), tungsten (W), aluminum (Al), copper (Cu), titanium nitride (TiN), tantalum nitride (TaN), tungsten nitride (WN), cobalt (Co), molybdenum (Mo), an alloy thereof, or combinations thereof, and may be formed using a deposition process such as atomic layer deposition, chemical vapor deposition, physical vapor deposition, combinations of these, or the like. The bottom electrode 601 may be formed to a thickness of between about 100 Å and about 250 Å. However, any suitable materials and any suitable methods of manufacture may be utilized.

Once the bottom electrode 601 has been formed, the MTJ structure 603 may be formed. In an embodiment the MTJ structure 603 may be formed with an anti-ferromagnetic material, a ferromagnetic pinned layer, a tunneling layer, and a ferromagnetic free layer (not separately illustrated in FIG. 6 for clarity). In an embodiment the anti-ferromagnetic material (AFM) layer is formed over the bottom electrode 601. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn), iridium manganese (IrMn), rhodium manganese (RhMn), iron manganese (FeMn), combinations of these, or the like, using deposition methods such as atomic layer deposition, chemical vapor deposition, physical vapor deposition, combinations of these, or the like. The AFM layer may be formed to a thickness between about 100 Å to about 200 Å. However, any suitable material, deposition process, and thickness may be utilized.

The ferromagnetic pinned layer is formed over the AFM layer. The ferromagnetic pinned layer forms a permanent magnet and exhibits strong interactions with magnets. A direction of a magnetic moment of the ferromagnetic pinned layer is pinned by the adjacent AFM layer and is not changed during operation of its associated magnetic tunnel junction (MTJ) element. In certain embodiments, the ferromagnetic pinned layer includes one or more layers of cobalt-iron-boron (CoFeB), CoFeTa, NiFe, Co, CoFe, CoPt, alloys of Ni, Co and Fe, combinations of these, or the like, using deposition methods such as atomic layer deposition, chemical vapor deposition, physical vapor deposition, combinations of these, or the like. However, any suitable material and method of manufacture may be utilized.

The tunneling layer is formed over the ferromagnetic pinned layer. The tunneling layer is thin enough that electrons are able to tunnel through the tunneling layer when a biasing voltage is applied. In certain embodiments, the tunneling layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$) and may be deposited using a deposition process such as atomic layer deposition, chemical vapor deposition, physical vapor deposition, combinations of these, or the like. The tunneling layer may be deposited to a thickness between about 5 Å to about 30 Å.

The ferromagnetic free layer is formed over the tunneling layer. A direction of a magnetic moment of the ferromagnetic free layer is not pinned because there is no anti-ferromagnetic material adjacent the ferromagnetic free layer. Therefore, the magnetic orientation of this layer is adjustable, thus the layer is referred to as a free layer. In at least one embodiment, the direction of the magnetic moment of the ferromagnetic free layer is free to rotate parallel or anti-parallel to the pinned direction of the magnetic moment of the ferromagnetic pinned layer. The ferromagnetic free layer may include a ferromagnetic material similar to the material in the ferromagnetic pinned layer, and may include materials such as cobalt, nickel, iron or boron, using deposition processes such as atomic layer deposition, chemical vapor deposition, physical vapor deposition, combinations of these, or the like. However, any suitable materials and method of deposition may be utilized.

Once the MTJ structure 603 has been formed, the top electrode 605 is formed over the ferromagnetic free layer in order to provide electrical connection to other portions of the structure for electrical routing. The top electrode 605 includes a conductive material. In some embodiments, the top electrode 605 is similar to the bottom electrode 601 in terms of composition. For example, in some embodiments the top electrode 605 comprises titanium (Ti), tantalum (Ta), platinum (Pt), ruthenium (Ru), tungsten (W), aluminum (Al), copper (Cu), cobalt (Co), molybdenum (Mo), an alloy thereof, or combinations thereof. However, any suitable materials may be utilized.

FIG. 6 additionally illustrates a second photoresist 607 which is placed and patterned over the top electrode 605. In an embodiment the second photoresist 607 may be similar to the first photoresist 115, such as by being a tri-layer photoresist with a bottom anti-reflective coating, a middle hard mask layer, and a top photosensitive material and may be placed and patterned as described above with respect to FIG. 1. However, any suitable material or combination of materials may be utilized.

In an embodiment the second photoresist 607 may be placed and patterned to have a fourth width W4 of between about 40 nm and about 60 nm, or between about 30 nm and about 55 nm, or no more than 50 nm. Additionally, the second photoresist 607 may be placed so that a first center line 609 of the second photoresist 607 is aligned with a second center line 611 of the bottom electrode via 501. As such, the second photoresist 607 is directly centered over the bottom electrode via 501. However, any suitable widths and any suitable alignments may be utilized.

Figure 7A:
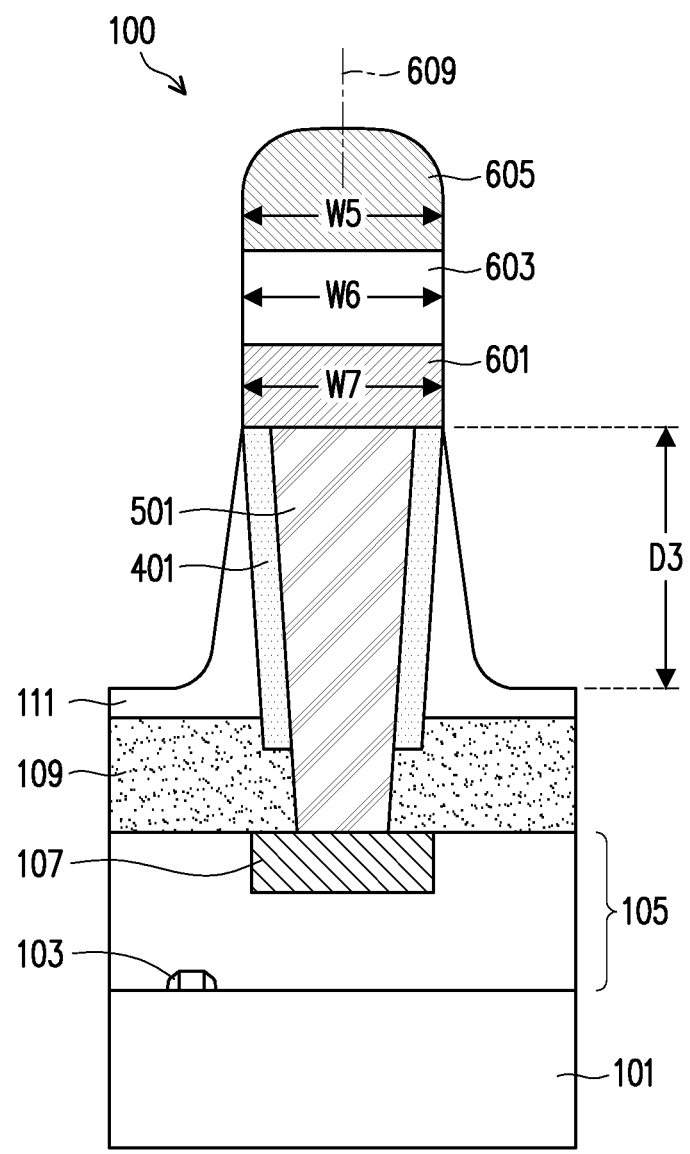
FIGS. 7A-7B illustrate an etching process, in accordance with some embodiments.

FIG. 7A illustrates that, once the second photoresist 607 has been placed, the underlying layers may be patterned using the second photoresist 607 as a mask, wherein the centerline 609 of the second photoresist 607 is transferred to the top electrode 605, the MTJ structure 603, and the bottom electrode 601. In an embodiment the underlying layers may be patterned using one or more anisotropic etching process such as a reactive ion etch. However, any suitable etching process may be utilized.

In an embodiment the one or more etching processes may be continued to pattern the top electrode 605, the MTJ structure 603, and the bottom electrode 601. After the anisotropic etching process the top electrode 605 may be formed to have a fifth width W5 of between about 30 nm and about 50 nm, the MTJ structure 603 may be formed to have a sixth width W6 of between about 40 nm and about 60 nm, and the bottom electrode 601 may be formed to have a seventh width W7 of between about 45 nm and about 65 nm. However, any suitable widths may be utilized.

FIG. 7A additionally illustrates that, once the one or more etching processes have been used to pattern the bottom electrode 601, the one or more etching processes may be continued in order to etch into the second dielectric layer 111. In an embodiment the one or more etching processes may etch into the second dielectric layer 111 to a third distance D3 of between about 500 Å and about 1000 Å. However, any suitable distance may be utilized.

Once the one or more etching processes have been utilized to pattern the top electrode 605, the MTJ structure 603, the bottom electrode 601, and the second dielectric layer 111, the second photoresist 607 may be removed (if not already removed during the previous etching processes). In an embodiment the second photoresist 607 may be removed using an ashing process, whereby the temperature of the second photoresist 607 is increased until the second photoresist 607 experiences a thermal decomposition which may then be easily removed. However, any suitable removal process may be used.

However, by forming the spacer 401 adjacent to the bottom electrode via 501, the etching of the second dielectric layer 111 can be performed with a reduction in risk of exposing and/or damaging the bottom electrode via 501. As such, the bottom electrode via 501 can have a reduction in width without risk. For example, the bottom electrode via 501 may have the third width W3 (see FIG. 5) that is less than the seventh width W7 of the bottom electrode 601 by at least the thickness of the spacers 401.

Figure 7B:
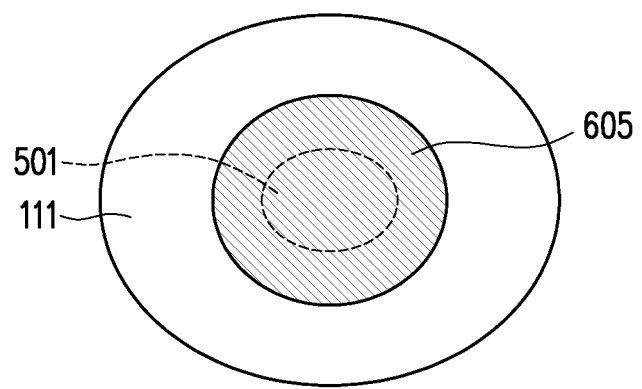

FIG. 7B illustrates a top down view of the structure illustrated in FIG. 7A. As can be seen in this view, the top electrode 605 fully covers the spacers 401 (which cannot be seen in the top down view). Additionally, the bottom electrode via 501 is centered beneath the top electrode 605. As such, the spacers 401 can help to prevent undesired etching and damage to the bottom electrode via 501 during etching of the second dielectric layer 111.

Figure 8:
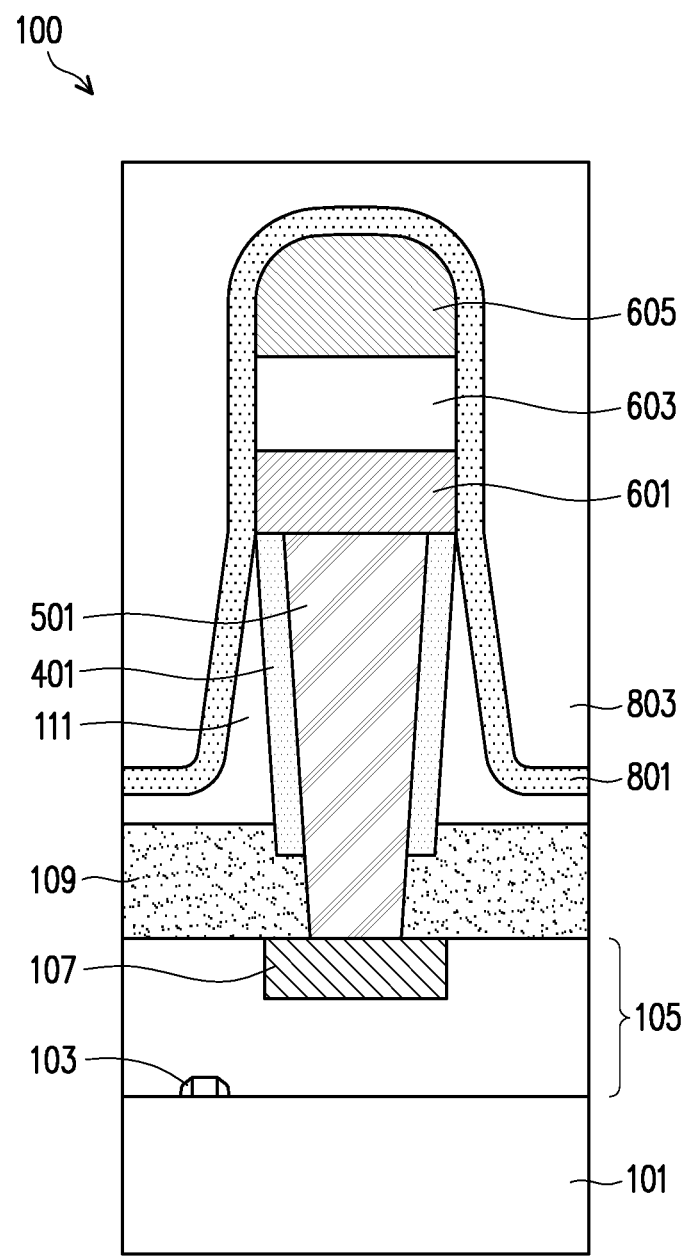
FIG. 8 illustrates formation of a dielectric material, in accordance with some embodiments.

FIG. 8 illustrates that, once the second dielectric layer 111 has been etched and the second photoresist 607 has been removed, a capping layer 801 may be deposited over the structure. In an embodiment the capping layer 801 may be a material such as silicon nitride, silicon carbon nitride, silicon carbon oxide, carbon nitride, the like, or a combination thereof, and may be deposited using a deposition process such as atomic layer deposition, chemical vapor deposition, physical vapor deposition, combinations of these, or the like, to a thickness of between about 20 Å and about 50 Å. However, any suitable material, any suitable deposition process, and any suitable thickness may be utilized.

Once the capping layer 801 has been formed, a fourth dielectric layer 803 may be deposited in order to cover the capping layer 801. In an embodiment the fourth dielectric layer 803 may comprise a material such as phospho-silicate glass (PSG), boro-silicate glass (BSG), boron-doped phospho-silicate glass (BPSG), undoped silicate glass (USG), combinations of these, or the like, although any suitable dielectrics may be used. The fourth dielectric layer 803 may be formed using a process such as PECVD, although other processes, such as LPCVD, may also be used.

Figure 9:
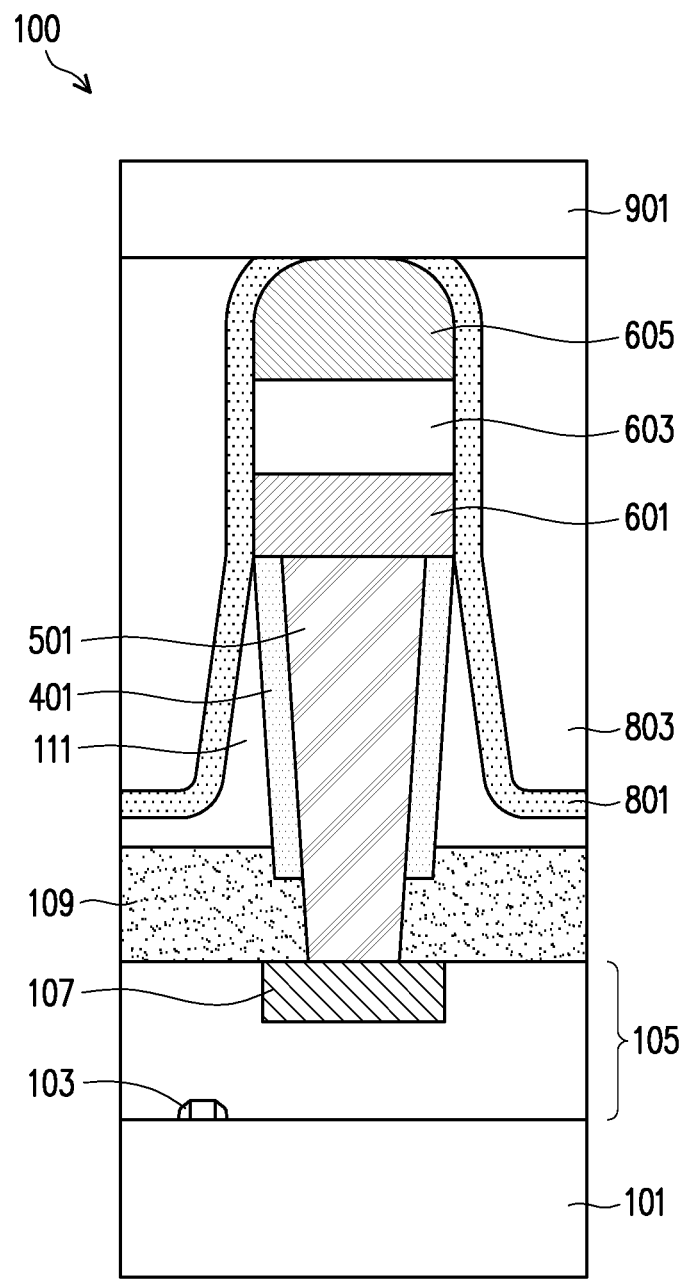
FIG. 9 illustrates formation of dielectric material, in accordance with some embodiments.

FIG. 9 illustrates that, once the fourth dielectric layer 803 has been deposited, the fourth dielectric layer 803 and the capping layer 801 are planarized in order to at least partially expose the top electrode 605. In an embodiment the fourth dielectric layer 803 may be planarized using a chemical mechanical polishing process. However, any suitable planarization process, such as mechanical grinding, etch back processes, or the like, may be utilized.

Once the top electrode 605 has been exposed, a fifth dielectric layer 901 may be deposited over the fourth dielectric layer 803. In an embodiment the fifth dielectric layer 901 may comprise a material such as phospho-silicate glass (PSG), boro-silicate glass (BSG), boron-doped phospho-silicate glass (BPSG), undoped silicate glass (USG), combinations of these, or the like, although any suitable dielectrics may be used. The fifth dielectric layer 901 may be formed using a process such as PECVD, although other processes, such as LPCVD, may alternatively be used.

Figure 10:
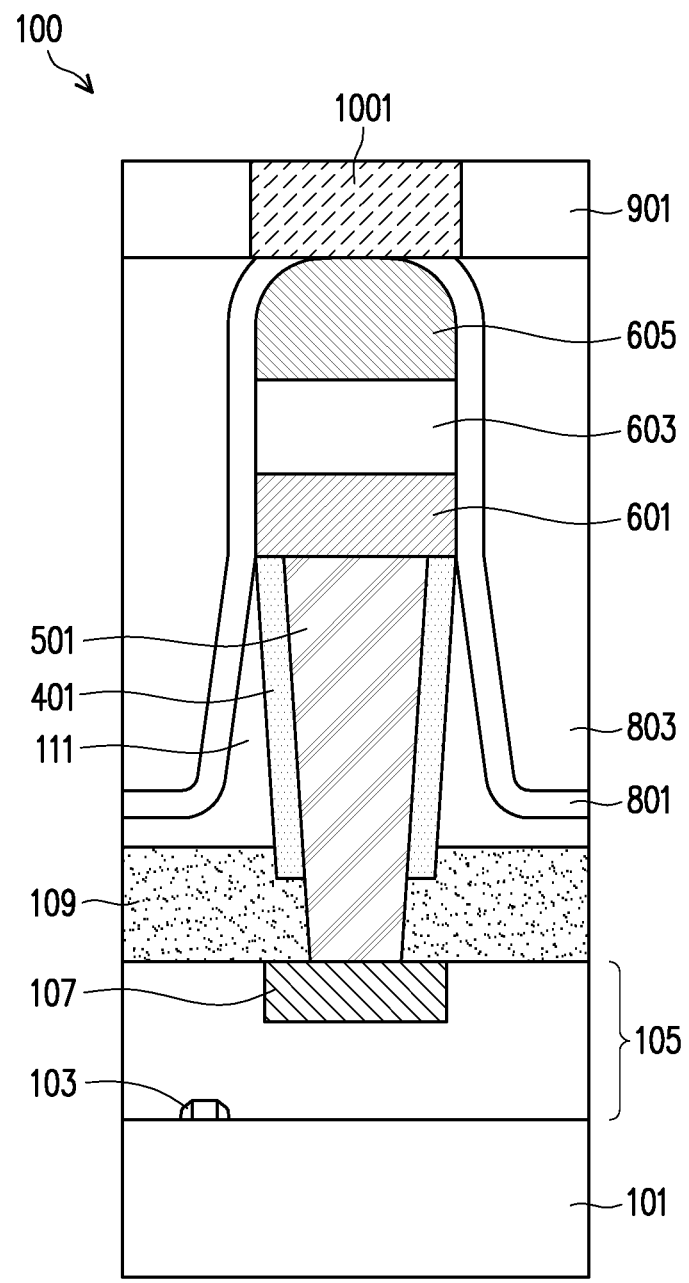
FIG. 10 illustrates formation of a contact, in accordance with some embodiments.

FIG. 10 illustrates that, once the fifth dielectric layer 901 has been deposited, a top contact 1001 is formed. In an embodiment the top contact 1001 is formed using a damascene or dual damascene process, whereby an opening is formed within the fifth dielectric layer 901, and the opening is filled with one or more conductive materials, such as barrier layers and fill materials such as copper, aluminum, tungsten, combinations of these, or the like. Once the opening has been filled, excess material of the barrier layers and fill material may be removed using, for example, a chemical mechanical polishing process. However, any suitable methods may be utilized.

Figure 11:
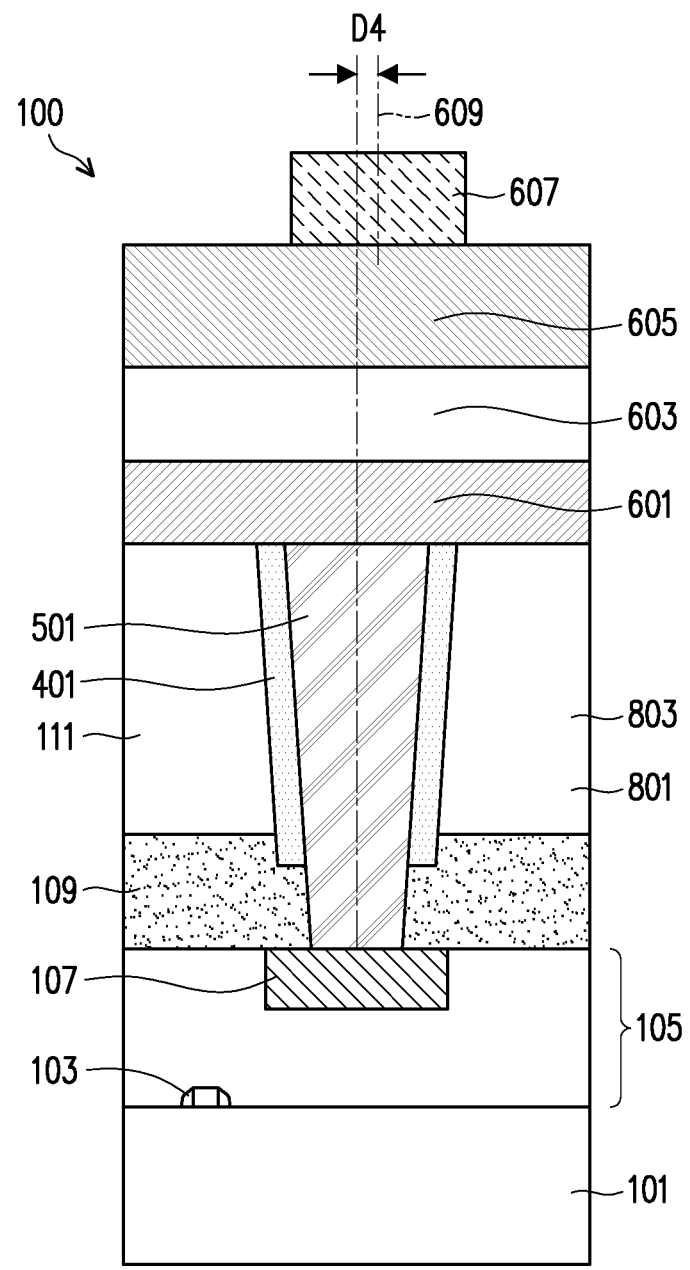
FIG. 11 illustrates placement of a photoresist in an offset position, in accordance with some embodiments.

FIG. 11 illustrates another embodiment in which, instead of the second photoresist 607 being placed so that it is centered over the bottom electrode via 501, the second photoresist 607 is offset from being centered over the bottom electrode via 501. As such, the first center line 609 of the second photoresist 607 is offset from the second center line 611 of the bottom electrode via 501 by a fourth distance D4 of between about 3 nm and about 10 nm. However, any suitable distance may be utilized.

Figure 12A:
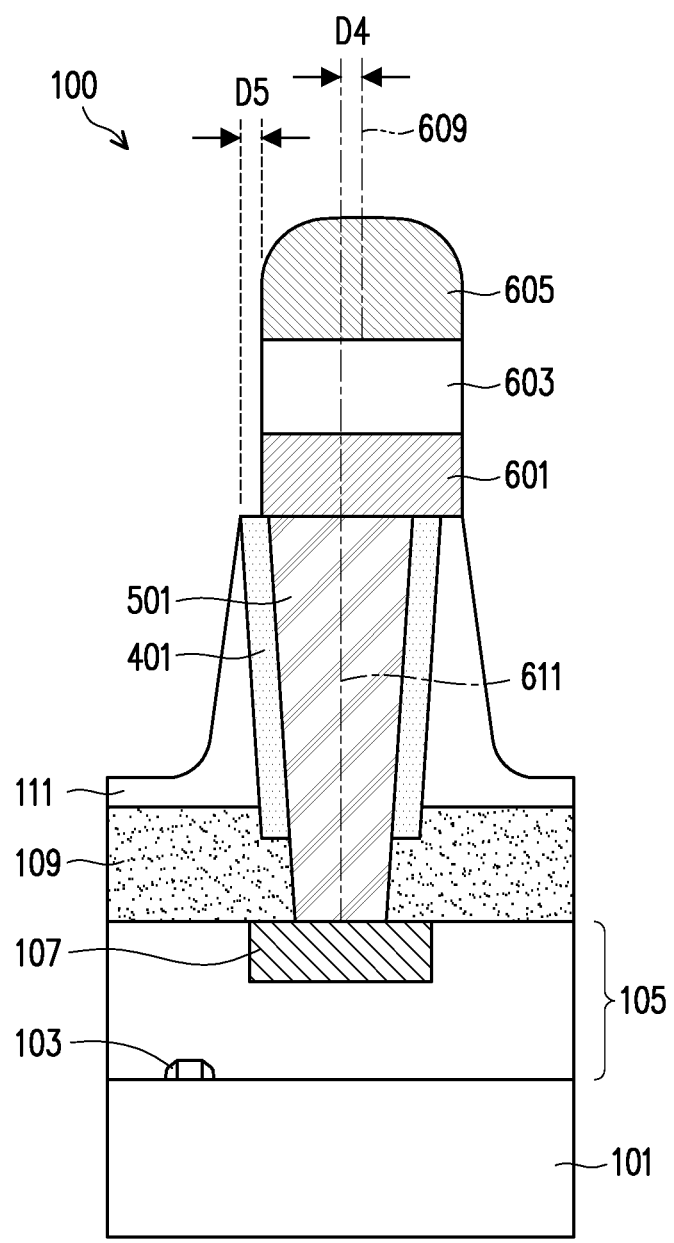
FIGS. 12A-12B illustrate an offset etching process, in accordance with some embodiments.

FIG. 12A illustrates a patterning of the top electrode 605, the MTJ structure 603, and the bottom electrode 601 using the offset second photoresist 607 in FIG. 11. In an embodiment the patterning of the top electrode 605, the MTJ structure 603, and the bottom electrode 601 may be performed as described above with respect to FIG. 7A. For example, one or more reactive ion etches may be utilized to sequentially etch through the top electrode 605, the MTJ structure 603, the bottom electrode 601 and the second dielectric layer 111. However, any suitable processes may be utilized.

In this embodiment, however, instead of the bottom electrode 601 fully covering the spacers 401, a top surface of the spacers 401 along one side is uncovered or partially uncovered during the patterning process while another side of the spacers 401 remains fully covered by the bottom electrode 601. In some embodiments, the top surface of the spacers 401 may be exposed for a fifth distance D5 of between about 10 Å and about 50 Å. However, any suitable distance may be utilized.

Figure 12B:
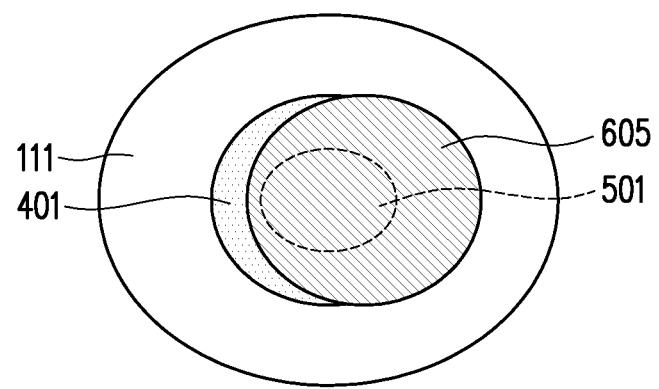

FIG. 12B illustrates a top down view of the structure of FIG. 12A. As can be seen in the top down view, the top electrode 605 is offset from the bottom electrode via 501, and a portion of the spacer 401 is exposed by the top electrode 605 along one side while being covered by the top electrode 605 along another side. As such, the bottom electrode via 501 may still be protected even if the top electrode 605 is offset from the bottom electrode via 501.

Figure 13:
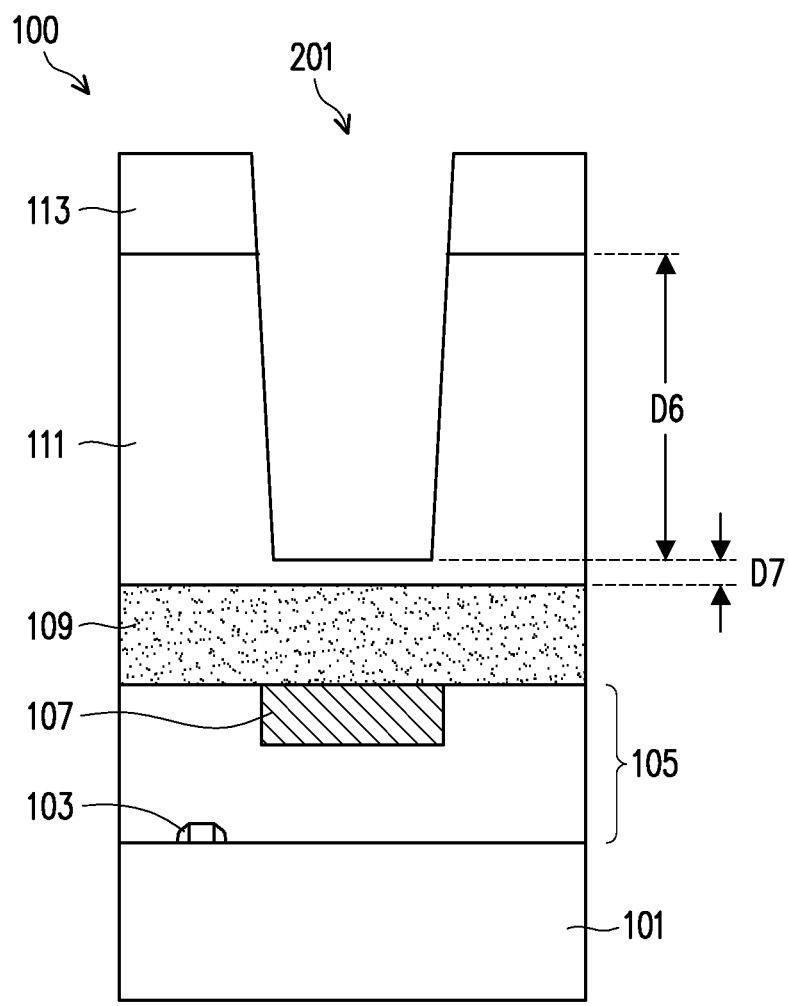
FIG. 13 illustrates a formation of the first opening fully into the second dielectric layer, in accordance with some embodiments.

FIG. 13 illustrates yet another embodiment in which the first opening 201, instead of extending all of the way through the second dielectric layer 111 and into the first dielectric layer 109, is formed to extend only partially through the second dielectric layer 111 without extending into the first dielectric layer 109. In an embodiment the formation of the first opening 201 may be performed as described above with respect to FIG. 2, such as one or more reactive ion etches. However, any other suitable methods may be utilized.

However, in this embodiment, the etching process is stopped prior to etching through the second dielectric layer 111, leaving a portion of the second dielectric layer 111 located between the first opening 201 and the first dielectric layer 109. In some embodiments, the first opening 201 extends into the second dielectric layer 111 a sixth distance D6 of between about 500 Å and about 1000 Å. As such, the portion of the second dielectric layer 111 located between the first opening 201 and the first dielectric layer 109 has a seventh distance D7 of between about 50 Å and about 150 Å. However, any suitable dimensions may be utilized.

Figure 14:
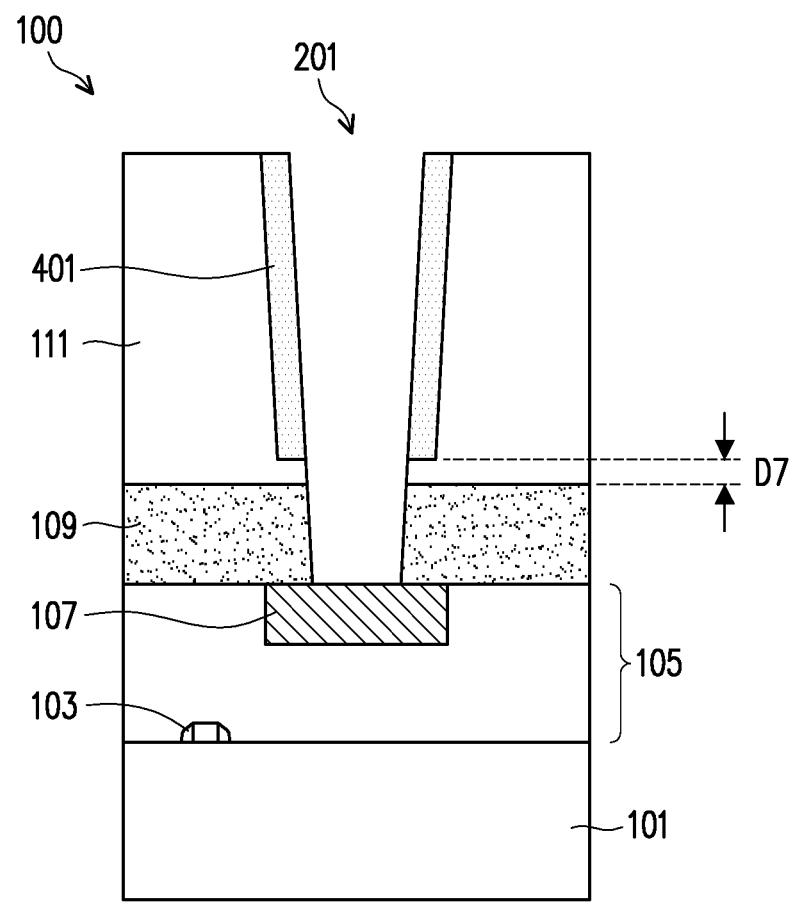
FIG. 14 illustrates a formation of the spacer fully within the second dielectric layer, in accordance with some embodiments.

FIG. 14 illustrates further processing steps which illustrates a formation of the spacers 401 along the sidewalls of the first opening 201. In an embodiment the spacers 401 may be formed as described above with respect to FIGS. 3-4. For example, the material of the spacers 401 is deposited to line the sidewalls of the first opening 201, and then the material is etched to remove portions of the material to form the spacers 401. However, any suitable methods may be utilized.

In this embodiment, however, the liner removal process which punches through the material of the spacers 401 located along a bottom of the first opening 201 and the first dielectric layer 109, also etches through the second dielectric layer 111 prior to punching through the first dielectric layer 109. As such, the spacers 401 are formed to be located fully within the second dielectric layer 111 without extending into the first dielectric layer 109. Further, the spacers 401 may be spaced apart from the first dielectric layer 109 by the seventh distance D7. However, any suitable distances may be utilized.

Figure 15A:
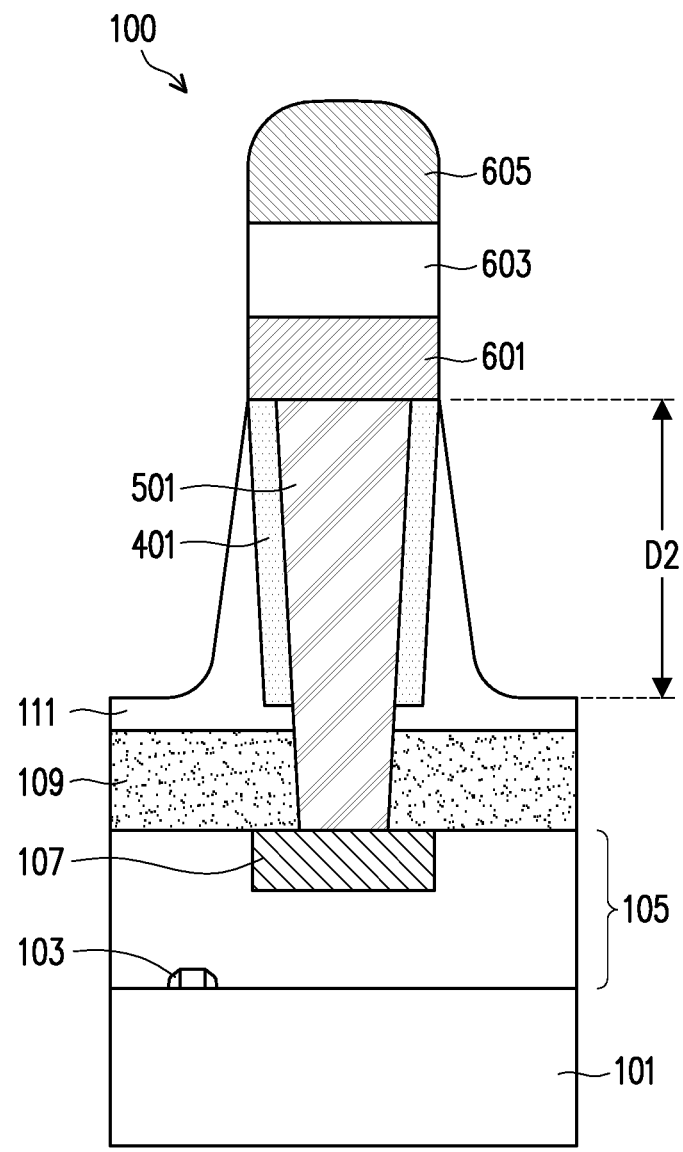
FIGS. 15A-15B illustrate a formation of the bottom electrode, the MTJ structure, and the top electrode, in accordance with some embodiments.

FIG. 15A illustrates formation of the bottom electrode via 501, the bottom electrode 601, the MTJ structure 603, and the top electrode 605 after formation of the spacers 401 fully within the second dielectric layer 111. In an embodiment the bottom electrode via 501, the bottom electrode 601, the MTJ structure 603, and the top electrode 605 may be formed as described above with respect to FIG. 5 and FIG. 6. For example, the materials of the top electrode 605, the MTJ structure 603, and the bottom electrode 601 are deposited, a photoresist is placed and patterned to be centered with the bottom electrode via 501, and then the materials of the top electrode 605, the MTJ structure 603, and the bottom electrode 601 are etched. However, any suitable processes may be utilized.

Figure 15B:
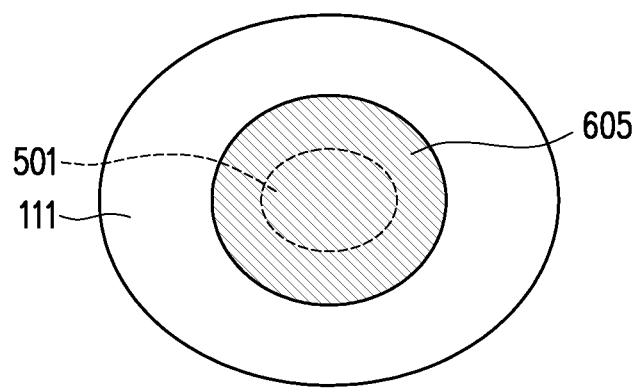

FIG. 15B illustrates a top down view of the structure of FIG. 15A. As can be seen in this view, the top electrode 605 fully covers the spacers 401 (which cannot be seen in the top down view). Additionally, the bottom electrode via 501 is centered beneath the top electrode 605. As such, the spacers 401 can help to prevent undesired etching and damage to the bottom electrode via 501 during etching of the second dielectric layer 111.

Figure 16A:
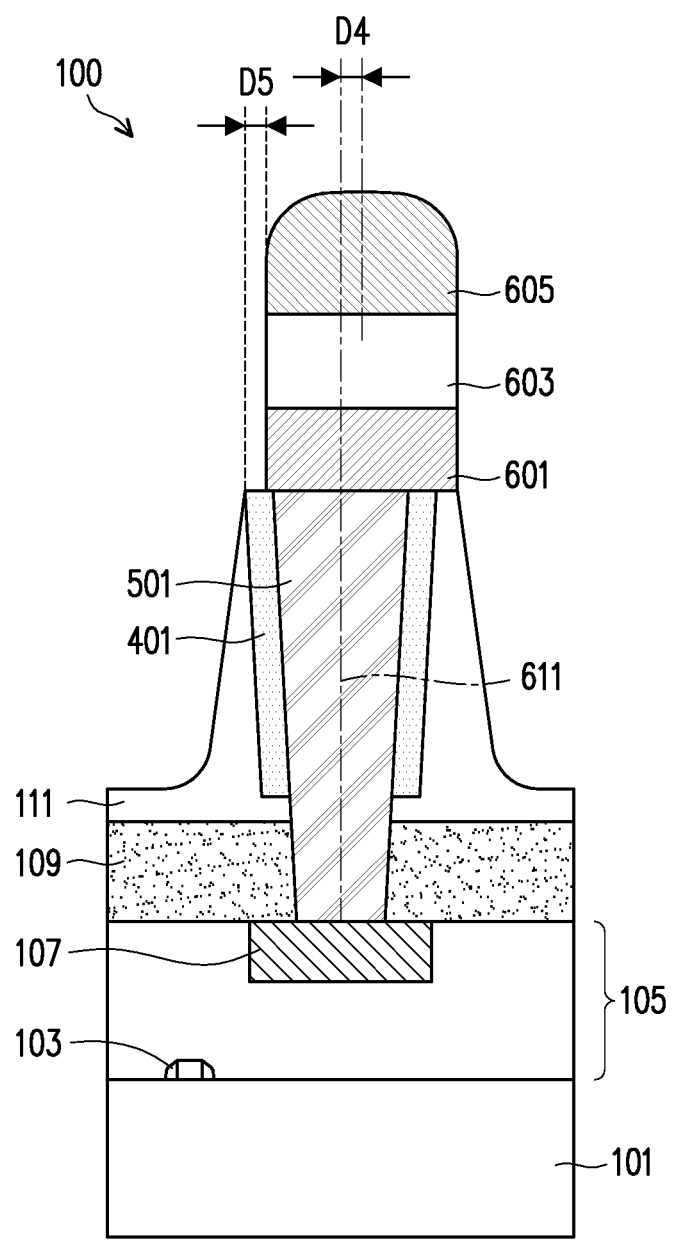
FIGS. 16A-16B illustrate an offset embodiment with the spacer formed fully within the second dielectric layer, in accordance with some embodiments.

FIG. 16A illustrates yet another embodiment in which the spacers are formed within the second dielectric layer 111 and also in which the top surface of the spacers 401 are partially exposed during the etching of the top electrode 605, the MTJ structure 603, and the bottom electrode 601. In this embodiment the spacers 401 are formed as described above with respect to FIGS. 13-14, in which the spacers 401 are formed fully within the second dielectric layer 111 and do not extend into the first dielectric layer 109. However, any suitable process may be utilized to form the spacers 401.

Additionally in this embodiment, the second photoresist 607 is placed and patterned in order to be offset from the second center line 611 of the bottom electrode via 501 as described above with respect to FIGS. 11-12A. Further, the top electrode 605, the MTJ structure 603, and the bottom electrode 601 are patterned using the offset second photoresist 607, resulting in a portion of the top surface of the spacers 401 to be exposed (e.g., by an amount of the fifth distance D5). However, any suitable processes may be utilized.

Figure 16B:
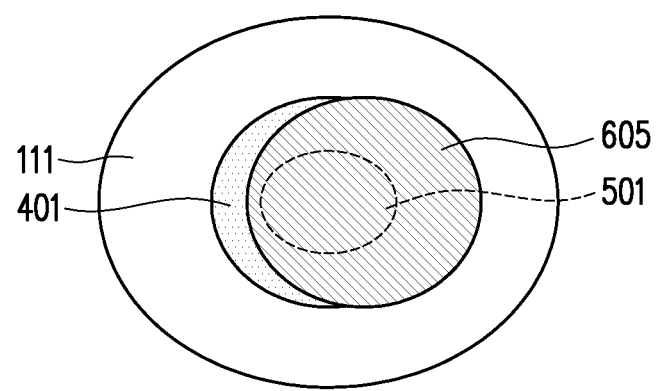

FIG. 16B illustrates a top down view of the structure of FIG. 16A. As can be seen in the top down view, the top electrode 605 is offset from the bottom electrode via 501, and a portion of the spacer 401 is exposed by the top electrode 605 along one side while being covered by the top electrode 605 along another side. As such, the bottom electrode via 501 may still be protected even if the top electrode 605 is offset from the bottom electrode via 501.

Figure 17A:
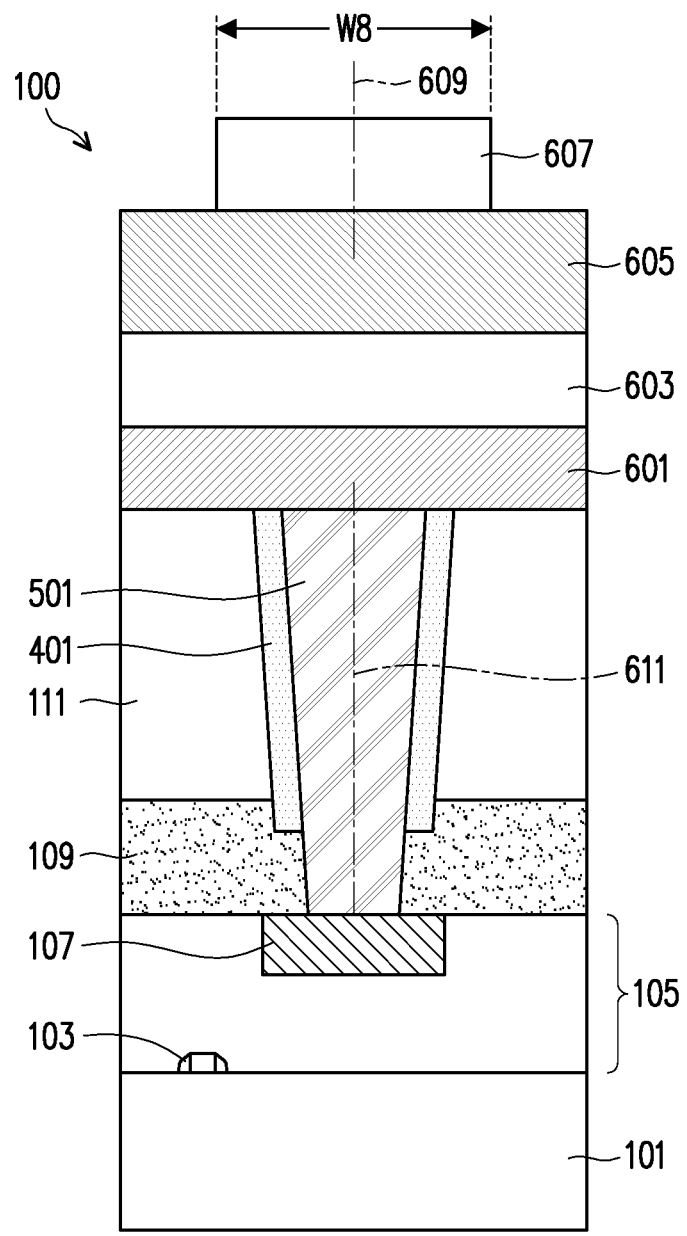
FIGS. 17A-17C illustrate an embodiment in which portions of dielectric material remain adjacent to the spacer, in accordance with some embodiments.

FIG. 17A illustrates yet another embodiment in which the width of the second photoresist 607 is expanded such that the etching of the second dielectric layer 111 leaves a layer of the second dielectric layer 111 along the spacers 401 to provide additional protection. In this embodiment the process may be initiated as discussed above with respect to FIGS. 1-6, with the spacer 401 being formed to be located completely through the second dielectric layer 111 and at least partially within the first dielectric layer 109. However, when the second photoresist 607 is placed and patterned, the second photoresist 607 is expanded to an eighth width W8 of between about 25 nm and about 80 nm. However, any suitable widths may be utilized.

Once the second photoresist 607 has been placed and patterned, the second photoresist 607 is then utilized to pattern the top electrode 605, the MTJ structure 603, the bottom electrode 601, and the second dielectric layer 111. For example, one or more etching processes may be utilized to etch the material of the top electrode 605, the MTJ structure 603, the bottom electrode 601, and the second dielectric layer 111. As such, the top electrode 605 may be formed to have a ninth width W9 of between about 25 nm and about 70 nm, the MTJ structure 603 may be formed to have a tenth width W10 of between about 25 nm and about 75 nm, and the bottom electrode 601 may be formed to have an eleventh width W11 of between about 25 nm and about 80 nm. However, any suitable widths may be utilized.

In this embodiment, however, the expanded width of the second photoresist 607 (e.g., the eighth width W8) causes the etching process to leave behind a portion of the second dielectric layer 111 along sidewalls of the spacers 401. Additionally, the second dielectric layer 111 will have a width adjacent to the spacers 401 and beneath the bottom electrode 601 a sixth distance D6 of between about 10 Å and about 100 Å. However, any suitable dimensions may be utilized.

Figure 17B:
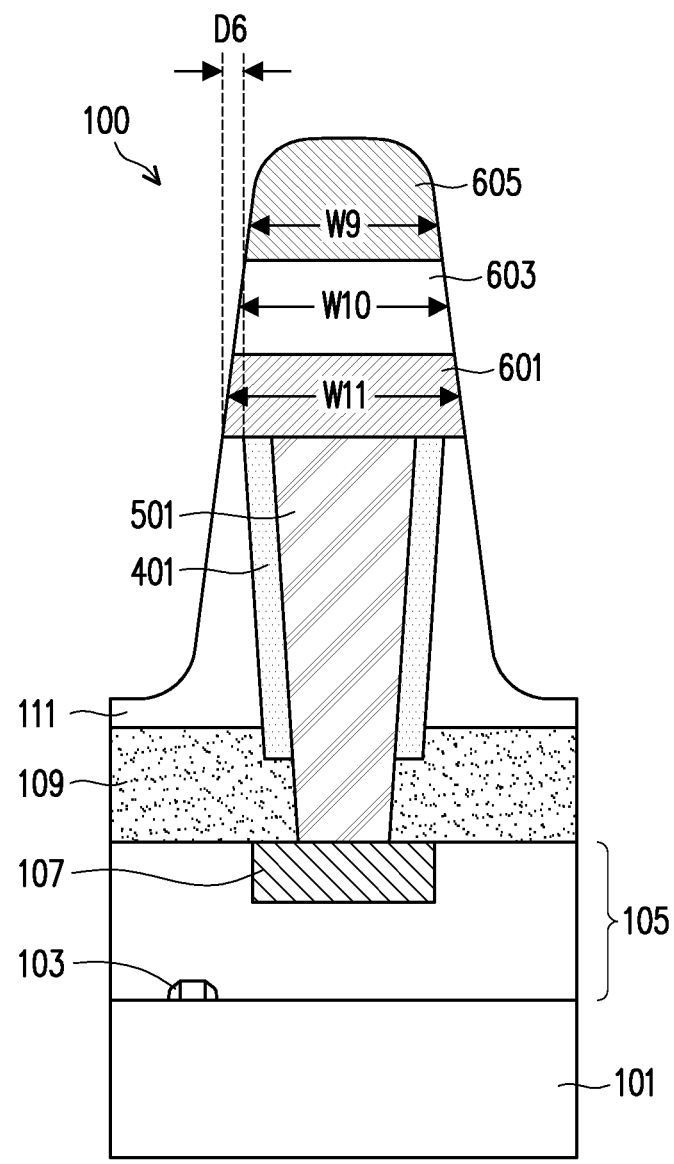
Figure 17C:
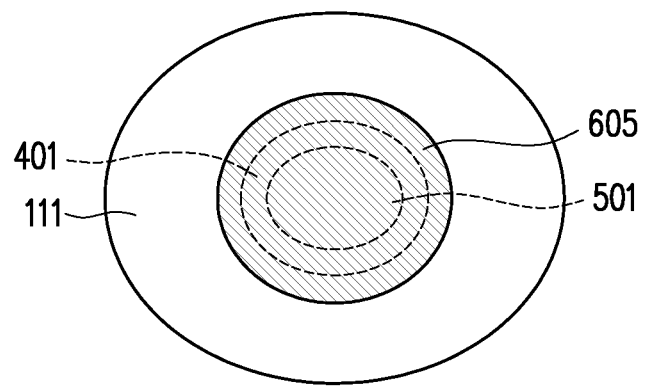

FIG. 17C illustrates a top down view of the structure of FIG. 17B. As can be seen, in this embodiment the top electrode 605 overlies not only the bottom electrode via 501 and the spacers 401, but also overlies a portion of the second dielectric layer 111. By overlying the portion of the second dielectric layer 111, the portion of the second dielectric layer 111 helps the spacers 401 to protect the bottom electrode via 501 from damage during etching processes.

Figure 18A:
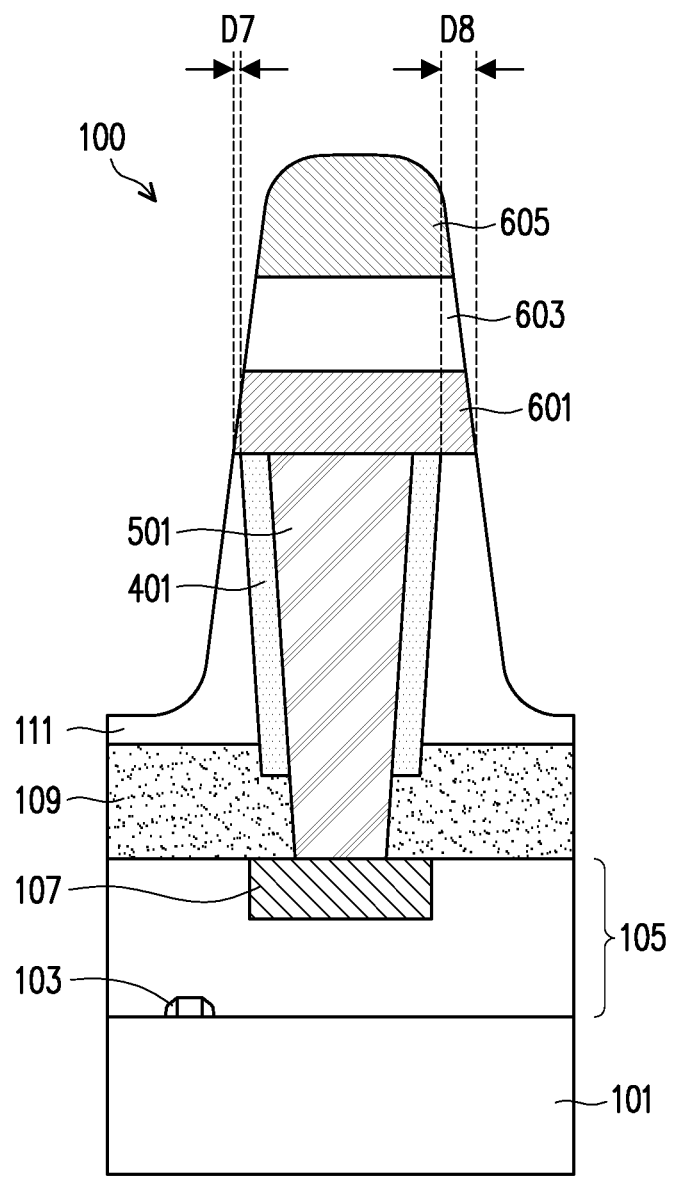
FIGS. 18A-18B illustrate an offset embodiment in which portions of dielectric material remain adjacent to the spacer, in accordance with some embodiments.

FIG. 18A illustrates yet another embodiment in which a portion of the second dielectric layer 111 remains alongside top portions of the spacers 401 (similar to the embodiment illustrated in FIGS. 17A-17C). For example, in this embodiment the second photoresist 607 is placed and patterned as described above with respect to FIGS. 17A-17C. In this embodiment, however, the second photoresist 607 is placed and patterned offset as described above with respect to FIGS. 11-12B.

Given the offset placement and patterning of the second photoresist 607, while the spacers 401 will remain covered by the bottom electrode 601, the portion of the second dielectric layer 111 adjacent to a first side of the spacers 401 may extend away from the spacers 401 a smaller distance than adjacent to a second side of the spacers 401. For example, on the first side of the spacers 401 the second dielectric layer 111 may extend to a seventh distance D7 of between about 1 Å and about 5 Å, while on the second side of the spacers 401 the second dielectric layer 111 may extend to an eighth distance D8 of between about 5 Å and about 10 Å. However, any suitable distances may be utilized.

Figure 18B:
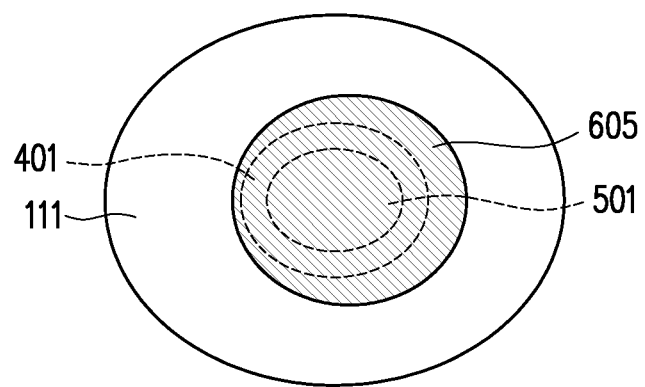

FIG. 18B illustrates a top down view of the structure of FIG. 18A. As can be seen, the top electrode 605 is offset from the bottom electrode via 501 but still fully covers the spacers 401. Additionally, the top electrode 605 covers a portion of the second dielectric layer 111 in addition to the spacers 401. In this embodiment, however, the top electrode 605 covers less of the second dielectric layer 111 along the first side of the spacer 401 than along a second side of the spacer 401.

Figure 19A:
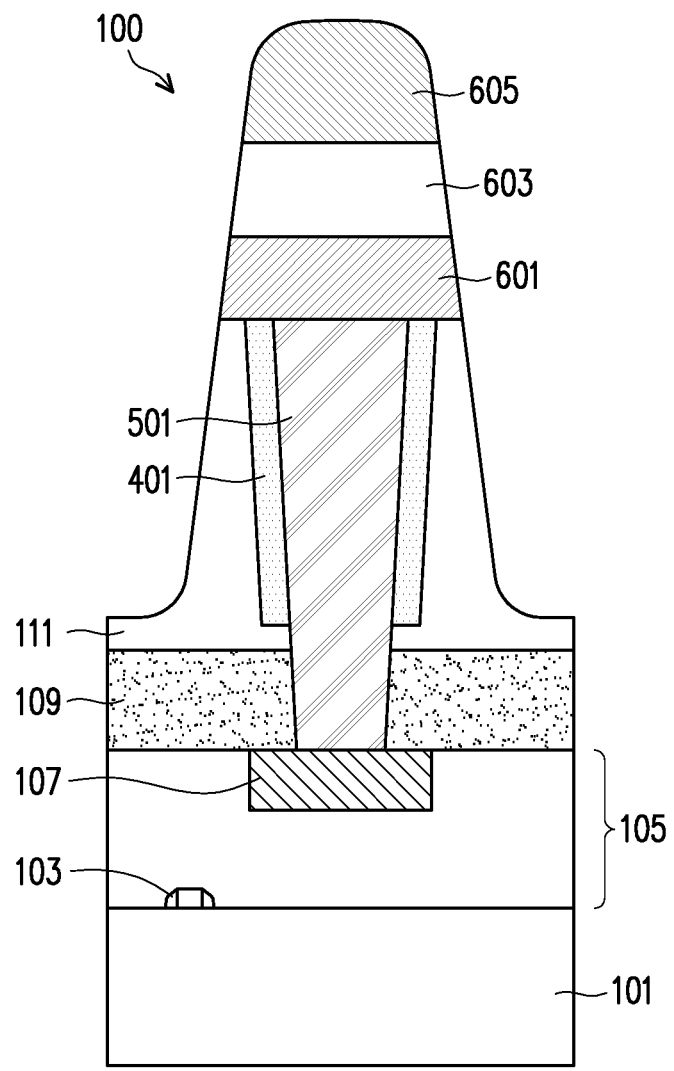
FIGS. 19A-19B illustrate an embodiment in which portions of dielectric material remains adjacent to the spacer and the spacer is formed fully within the dielectric material, in accordance with some embodiments.

FIG. 19A illustrates yet another embodiment in which the process leaves a portion of the second dielectric layer 111 along sidewalls of the spacers 401, similar to the embodiment described above with respect to FIGS. 17A-17C. In this embodiment, however, the spacers 401 are not formed fully through the second dielectric layer 111 and into the first dielectric layer 109, but are, rather, formed to be fully formed within the second dielectric layer 111 without extending into the first dielectric layer 109. For example, the spacer 401 may be formed as described above with respect to FIGS. 13-14. However, any suitable processes may be utilized.

Figure 19B:
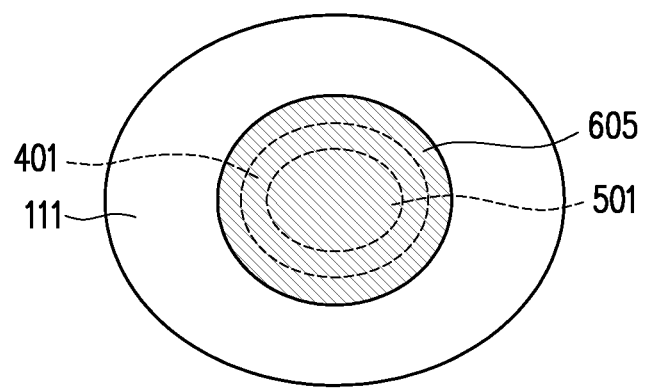

FIG. 19B illustrates a top down view of the structure of FIG. 19A. As can be seen, in this embodiment the top electrode 605 overlies not only the bottom electrode via 501 and the spacers 401, but also overlies a portion of the second dielectric layer 111. By overlying the portion of the second dielectric layer 111, the portion of the second dielectric layer 111 helps the spacers 401 to protect the bottom electrode via 501 from damage during etching processes.

Figure 20A:
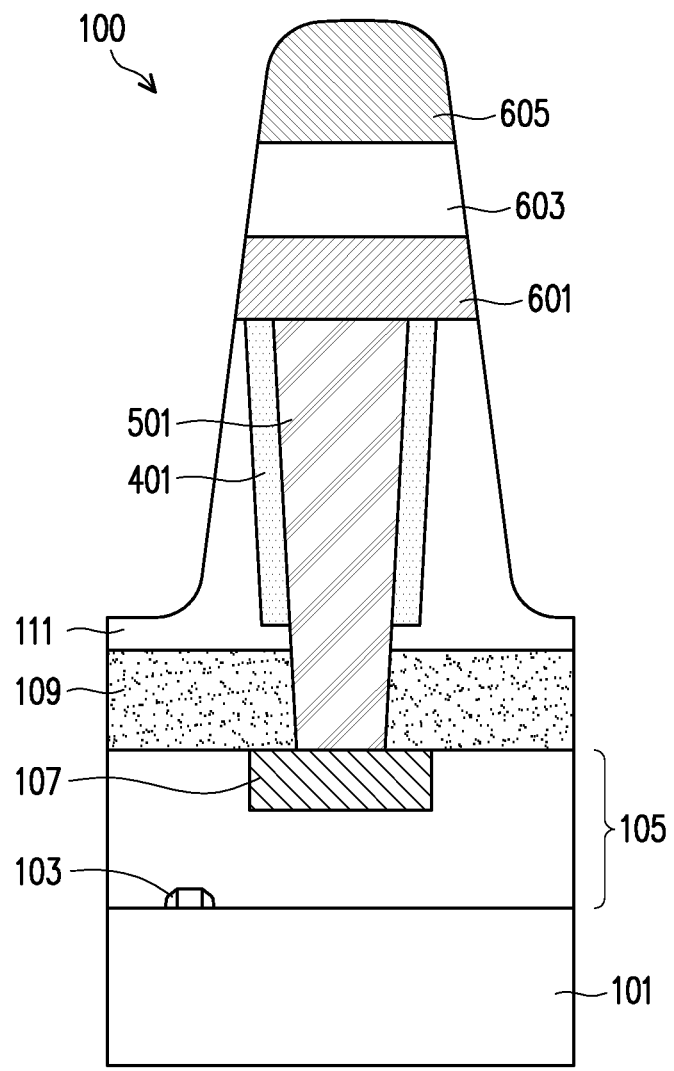
FIGS. 20A-20B illustrate an offset embodiment in which portions of dielectric material remains adjacent to the spacer and the spacer is formed fully within the dielectric material, in accordance with some embodiments.

FIG. 20A illustrates yet another embodiment in which the process leaves a portion of the second dielectric layer 111 along sidewalls of the spacers 401, similar to the embodiment described above with respect to FIGS. 18A-18B. In this embodiment, however, the spacers 401 are not formed fully through the second dielectric layer 111 and into the first dielectric layer 109, but are, rather, formed to be fully formed within the second dielectric layer 111 without extending into the first dielectric layer 109. For example, the spacer 401 may be formed as described above with respect to FIGS. 13-14. However, any suitable processes may be utilized.

Figure 20B:
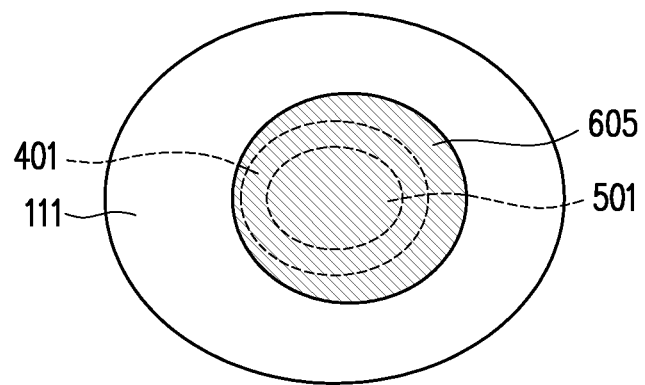

FIG. 20B illustrates a top down view of the structure of FIG. 20A. As can be seen, the top electrode 605 is offset from the bottom electrode via 501 and fully covers the spacers 401. Additionally, the top electrode 605 covers a portion of the second dielectric layer 111 in addition to the spacers 401. In this embodiment, however, the top electrode 605 covers less of the second dielectric layer 111 along the first side of the spacer 401 than along a second side of the spacer 401.

By utilizing the spacer 401 alongside the bottom electrode via 501, the bottom electrode via 501 can be protected from etching processes. Such protection allows the bottom electrode via 501 to be formed to a smaller dimension without worrying about undesired damage, thereby allowing the process windows for etching processes to be enlarged.

In accordance with an embodiment, a method of manufacturing a semiconductor device includes: forming a first dielectric layer and a second dielectric layer over a conductive line; forming a first opening within at least the second dielectric layer; forming a spacer along sidewalls of the first opening, the spacer comprising a dielectric material; filling the first opening with a conductive material, the conductive material in physical contact with the conductive line; forming a bottom electrode over the conductive material; forming an MTJ structure over the bottom electrode; and forming a top electrode over the MTJ structure. In an embodiment the forming the first opening forms the first opening within at least the first dielectric layer. In an embodiment the forming the first opening forms the first opening outside of the first dielectric layer. In an embodiment the forming the spacer further includes: depositing a material for the spacer; and removing portions of the material from horizontal surfaces. In an embodiment the top electrode has a centerline which is aligned with a centerline of the conductive material. In an embodiment the top electrode has a centerline which is offset from a centerline of the conductive material. In an embodiment at least a portion of the spacers is exposed by the bottom electrode.

In accordance with another embodiment, a method of manufacturing a semiconductor device includes: forming a first opening at least partially through a first dielectric layer over a conductive line; lining the first opening with a dielectric material; etching the dielectric material to form spacers and expose the conductive line; forming a via within the first opening; forming an magnetic tunnel junction (MTJ) structure over the via; and etching the MTJ structure and the first dielectric layer. In an embodiment the forming the first opening additionally forms the first opening through a second dielectric layer, the second dielectric layer being located between the conductive line and the first dielectric layer. In an embodiment the etching the MTJ structure and the first dielectric layer exposes a top surface of the spacers. In an embodiment the lining the first opening with the dielectric material lines the first opening with silicon nitride. In an embodiment after the etching the dielectric material to form the spacers the spacers are located solely within the first dielectric layer. In an embodiment the etching the MTJ structure and the first dielectric layer exposes a top surface of the spacers. In an embodiment after the etching the MTJ structure and the first dielectric layer, a portion of the first dielectric layer remains adjacent to a top surface of the spacers.

In accordance with yet another embodiment, a semiconductor device includes: a conductive line over a substrate; a spacer located over and spaced apart from the conductive line, the spacer being located within at least a first dielectric layer; a via extending through the spacer to make physical contact with the conductive line; a bottom electrode in physical contact with the via; a MTJ structure in physical contact with the bottom electrode; and a top electrode in physical contact with the MTJ structure. In an embodiment a top surface of the spacer is covered by the bottom electrode. In an embodiment a top surface of the spacer is at least partially exposed by the bottom electrode. In an embodiment the spacer is fully located within the first dielectric layer. In an embodiment the spacer is located within a second dielectric layer different from the first dielectric layer. In an embodiment the bottom electrode has a width that is larger than a width of the via by a first distance, the first distance being at least as large as a thickness of the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first dielectric layer and a second dielectric layer over a conductive line;
   forming a first opening within at least the second dielectric layer;
   forming a spacer along sidewalls of the first opening and separated from the conductive line, the spacer comprising a dielectric material;
   filling the first opening with a conductive material, the conductive material in physical contact with the conductive line;

forming a bottom electrode over the conductive material;
forming an MTJ structure over the bottom electrode; and
forming a top electrode over the MTJ structure.

2. The method of claim 1, wherein the forming the first opening forms the first opening within at least the first dielectric layer.

3. The method of claim 1, wherein the forming the first opening forms the first opening outside of the first dielectric layer.

4. The method of claim 1, wherein the forming the spacer further comprises:
depositing a material for the spacer; and
removing portions of the material from horizontal surfaces.

5. The method of claim 1, wherein the top electrode has a centerline which is aligned with a centerline of the conductive material.

6. The method of claim 1, wherein the top electrode has a centerline which is offset from a centerline of the conductive material.

7. The method of claim 6, wherein at least a portion of the spacers is exposed by the bottom electrode.

8. The method of claim 1, wherein the bottom electrode has a width that is larger than a width of the conductive material by a first distance, the first distance being at least as large as a thickness of the spacer.

9. The method of claim 1, wherein the dielectric material is silicon nitride.

10. A method of manufacturing a semiconductor device, the method comprising:
forming a first opening at least partially through a first dielectric layer over a conductive line;
lining the first opening with a dielectric material;
etching the dielectric material to form spacers and expose the conductive line;
forming a via within the first opening;
forming a magnetic tunnel junction (MTJ) structure over the via; and
etching the MTJ structure and the first dielectric layer, wherein the etching the MTJ structure and the first dielectric layer exposes a top surface of the spacers.

11. The method of claim 10, wherein the forming the first opening additionally forms the first opening through a second dielectric layer, the second dielectric layer being located between the conductive line and the first dielectric layer.

12. The method of claim 10, wherein the lining the first opening with the dielectric material lines the first opening with silicon nitride.

13. The method of claim 10, wherein after the etching the dielectric material to form the spacers the spacers are located solely within the first dielectric layer.

14. The method of claim 10, wherein after the etching the MTJ structure and the first dielectric layer, a portion of the first dielectric layer remains adjacent to a top surface of the spacers.

15. The method of claim 10, wherein a top electrode over the MTJ structure has a centerline which is aligned with a centerline of the via.

16. A method of manufacturing a semiconductor device, the method comprising:
forming a conductive line over a substrate;
forming a spacer located over and spaced apart from the conductive line, the spacer being located within at least a first dielectric layer;
forming a via extending through the spacer to make physical contact with the conductive line;
forming a bottom electrode in physical contact with the via;
forming a MTJ structure in physical contact with the bottom electrode; and
forming a top electrode in physical contact with the MTJ structure.

17. The method of claim 16, wherein the forming the bottom electrode forms the bottom electrode such that a top surface of the spacer is covered by the bottom electrode.

18. The method of claim 16, wherein the forming the bottom electrode forms the bottom electrode such that a top surface of the spacer is at least partially exposed by the bottom electrode.

19. The method of claim 16, wherein the forming the spacer forms the spacer so that the spacer is fully located within the first dielectric layer.

20. The method of claim 16, wherein the forming the spacer forms the spacer so that the spacer is located within a second dielectric layer different from the first dielectric layer.

* * * * *